United States Patent
Hong et al.

(10) Patent No.: US 9,777,916 B2
(45) Date of Patent: Oct. 3, 2017

(54) LIGHT SOURCE MODULE, FABRICATION METHOD THEREFOR, AND LIGHTING DEVICE INCLUDING THE SAME

(71) Applicant: LG ELECTRONICS INC., Seoul (KR)

(72) Inventors: Jaepyo Hong, Seoul (KR); Jaechan Kim, Seoul (KR); Injoong Kim, Seoul (KR); Hyeuk Chang, Seoul (KR); Sumin Jun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/153,114

(22) Filed: May 12, 2016

(65) Prior Publication Data

US 2017/0009978 A1    Jan. 12, 2017

(30) Foreign Application Priority Data

Jul. 6, 2015    (KR) .......................... 10-2015-0096032
Dec. 14, 2015  (KR) .......................... 10-2015-0178655

(51) Int. Cl.
*F21V 21/00*    (2006.01)
*F21V 29/83*    (2015.01)
(Continued)

(52) U.S. Cl.
CPC ................ *F21V 29/83* (2015.01); *F21K 9/20* (2016.08); *F21K 9/90* (2013.01); *F21V 5/04* (2013.01);
(Continued)

(58) Field of Classification Search
CPC . F21V 29/83; F21V 29/77; F21V 7/22; F21V 5/02; F21V 5/04; F21V 15/01;
(Continued)

(56) References Cited

U.S. PATENT DOCUMENTS 8,674,626 B2 *  3/2014  Siemiet ..................... G01J 1/32
                                                            315/129
8,876,322 B2 * 11/2014  Alexander .......... F21V 19/0015
                                                          362/217.12
(Continued)

FOREIGN PATENT DOCUMENTS

EP        22313-1450 A2      6/2013
KR    10-2006-0114880 A     11/2006
(Continued)

*Primary Examiner* — Ali Alavi
(74) *Attorney, Agent, or Firm* — Birch, Stewart, Kolasch & Birch, LLP

(57) ABSTRACT

A light source module includes at least one light source and a body supporting the light source. The body includes a heat sink supporting the light source on a top surface thereof for absorbing heat from the light source and dissipating the heat to the outside, an electrically insulating layer provided on at least one surface of the heat sink, and a conductive layer provided on the insulating layer, the conductive layer being at least provided in a path region through which electric current is applied to the light source. The conductive layer includes light source connection parts supplying the electric current to the light source, and a light source mounting part disposed between the light source connection parts. One portion of the light source connection part is divided into at least two portions to be connected to each other. Accordingly, it is possible to obtain effects such as rapid fabrication processes, inexpensive fabrication cost, facilitation of mass production, improvement of product yield, and optimization of a conductive material.

20 Claims, 11 Drawing Sheets

(51) Int. Cl.
| | |
|---|---|
| *H01L 33/62* | (2010.01) |
| *H01L 33/64* | (2010.01) |
| *F21V 29/77* | (2015.01) |
| *F21K 9/90* | (2016.01) |
| *F21V 5/04* | (2006.01) |
| *F21V 7/22* | (2006.01) |
| *F21V 15/01* | (2006.01) |
| *F21V 23/00* | (2015.01) |
| *F21V 31/00* | (2006.01) |
| *F21K 9/20* | (2016.01) |
| *F21Y 101/00* | (2016.01) |

(52) U.S. Cl.
CPC ............... *F21V 7/22* (2013.01); *F21V 15/01* (2013.01); *F21V 23/002* (2013.01); *F21V 29/77* (2015.01); *F21V 31/00* (2013.01); *H01L 33/62* (2013.01); *H01L 33/64* (2013.01); *H01L 33/647* (2013.01); *F21Y 2101/00* (2013.01)

(58) Field of Classification Search
CPC .......... F21V 31/00; F21V 23/002; F21K 9/10; F21K 9/90; F21Y 2101/02; F21Y 2101/025; H01L 33/62
See application file for complete search history.

(56) References Cited

U.S. PATENT DOCUMENTS

| | | | |
|---|---|---|---|
| 9,653,670 B2* | 5/2017 | Illek | ............ H01L 33/64 |
| 2010/0052126 A1 | 3/2010 | Hui et al. | |
| 2011/0291149 A1 | 12/2011 | Sugizaki et al. | |
| 2015/0146422 A1 | 5/2015 | Kwak et al. | |
| 2016/0148911 A1 | 5/2016 | Do | |

FOREIGN PATENT DOCUMENTS

| | | |
|---|---|---|
| KR | 10-1472403 B1 | 12/2014 |
| WO | WO 2015/005655 A1 | 1/2015 |

* cited by examiner

LIGHT SOURCE MODULE, FABRICATION METHOD THEREFOR, AND LIGHTING DEVICE INCLUDING THE SAME

CROSS-REFERENCE TO RELATED APPLICATIONS

The present application claims the benefits of priority to Korean Patent Application No. 10-2015-0178655 filed on 14 Dec. 2015, and 10-2015-0096032 filed on 6 Jul. 2015, which are herein incorporated by reference in their entirety.

BACKGROUND

The present disclosure relates to a light source module, a fabrication method therefor, and a lighting device including the same.

In general, incandescent bulbs or fluorescent lamps are frequently used as indoor or outdoor lighting devices. However, the lifespan of the incandescent bulbs or the fluorescent lamps is short, and therefore, it is necessary to frequently replace the incandescent bulbs or the fluorescent lamps with new ones. The fluorescent lamps can be used for a long period of time as compared with the incandescent bulbs, but are harmful to the environment. In addition, the fluorescent lamps are deteriorated over time, and therefore, the illumination intensity of the fluorescent lamps is gradually reduced.

In order to solve these problems, there has been proposed a light emitting diode (LED) capable of exhibiting excellent controllability, rapid response speed, high electric/light conversion efficiency, long lifespan, low power consumption, high luminance, and emotional lighting. Also, there have been developed various types of lighting modules and lighting devices employing the LED.

The LED is a semiconductor device that coverts electric energy into light. The LED has advantages of low power consumption, semi-permanent lifespan, rapid response speed, safety, and environmental friendly properties as compared with existing light sources such as fluorescent lamps and incandescent bulbs. For these reasons, much research has been conducted to replace the existing light sources with the LED. Furthermore, the LED has been increasingly used as light sources of lighting devices, such as various liquid crystal displays, electric bulletin boards, and streetlights, which are used indoors and outdoors.

A light emitting device (hereinafter, the light emitting device is mainly referred to as an LED, but the present disclosure is not limited thereto) is fabricated in the form of a light source module for improving assembly convenience and protecting the light emitting device from external impact and moisture. In the light source module, a plurality of light emitting devices is integrated with high density, and hence higher luminance can be realized. However, heat of a high temperature is generated as a side effect. Accordingly, much research has been conducted to effectively dissipate heat from the light emitting module.

Under the circumstances, Korean Patent Registration No. 10-1472403 filed and registered by the present applicant has disclosed a light source module for solving the problem of heat dissipation.

The light source module above is fabricated by coupling, to a heat sink, a printed circuit board having a plurality of light emitting devices mounted thereon. However, the heat transfer property of the printed circuit board is not excellent, and hence heat is not effectively transferred to the heat sink. Accordingly, in order to improve the heat dissipation efficiency of the printed circuit board, a thermal pad is further inserted between the printed circuit board and the heat sink.

SUMMARY

It is an object of the invention to provide a light source module, a fabrication method therefor, and lighting device including the same with improved heat dissipation efficiency and simplified production processes by eliminating the need for a separate printed circuit board and thermal pad, and to inexpensively produce the light source module in large quantities. This object is achieved with the features of the claims.

A preferred technical effect or advantage of the light source module is that a conductive material is not excessively provided on a heat sink and that the amount of the provided conductive material is reduced.

A preferred technical effect or advantage of the light source module is to prevent a conductive material provided on a heat sink from being expanded due to high temperature generated by a light source or high temperature generated in a fabrication process. Thus, according to the invention, the formation of a blister is preferably prevented.

A preferred technical effect or advantage of the light source module is to solve a problem that may occur in a bonding process for directly bonding a light source to a conductive material provided on the heat sink. Such problem may arise if solder paste and flux spills over.

A preferred technical effect or advantage of the fabrication method for a light source module is to solve a problem in that fabrication time and fabrication cost are excessively required due to a plurality of fabrication processes caused by coupling a printed circuit board to a heat sink and inserting a thermal pad between the printed circuit board and the heat sink. In turn, the invention avoids a thermal pad which decreases weight, simplifies the manufacturing process, and improves heat dissipation. Moreover, the fabrication process is simplified in that it is no longer necessary to attach a printed circuit board, PCB, with a plurality of screws. In one embodiment, a light source module comprises at least one light source emitting light; and a body supporting the light source. The body comprises a heat sink supporting the light source on a top surface thereof, the heat sink absorbing heat from the light source and dissipating the heat to the outside; an insulating layer provided on at least one surface of the heat sink, the insulating layer having electrical insulating properties; and a conductive layer provided on the insulating layer, the conductive layer for supplying electric current to the light source. The conductive layer comprises light source connection parts supplying the electric current to the light source; and a light source mounting part disposed between two light source connection parts, the light source mounting part having the light source mounted thereon, wherein one portion of a light source connection part is divided into at least two separate branches spaced from each other along their extension, the separate branches being connected to each other at opposing ends thereof.

The light source connection part may include: a division part dividing the conducting path into at least two conducting paths forming a pattern part.

The light source module may further comprise a contact part in which the conducting paths of the pattern part meet each other at one point.

At least one portion of the pattern part may be provided in a straight line or curved line.

The conducting paths of the pattern part may be disposed at both sides of the contact part, respectively.

The pattern part may be provided such that its left and right sides are symmetric with each other about the contact part. A neck may be provided between a light source mounting part and the light source connection part.

The light source connection part may comprise at its two opposite ends a single conductor path adjacent to the respective light source mounting path. The light source connection part may include a division part dividing such a single path through which electric current is applied into two or more separate paths. The light source connection part further comprises a contact part in which paths divided by the division part meet each other or merge with each other at one point, and a pattern part between the division part at each end and the contact part. The pattern part has a plurality of paths through which electric current can flow.

The light source connection part may include at least two division parts. Also, the light source connection part may include at least one contact part. Alternatively, the light source connection part may not include the contact part (that is, the branched off conductor paths are not united at some point between the division parts).

The pattern part may be disposed between the division part and the contact part. Also, the pattern part electrically connects the division part and the contact part to each other. Each conductor path in the pattern part may be formed in a straight line or curved line. However, the present disclosure is not limited to the above-described configuration.

In another embodiment, a method for fabricating a light source module includes: providing a heat sink; stacking an insulating layer on at least one surface of the heat sink; providing a conductive layer on the insulating layer, the conductive layer for supplying electric current to a light source, wherein the conductive layer comprises: light source connection parts supplying the electric current to the light source; and a light source mounting part disposed between two light source connection parts, the light source mounting part having the light source mounted thereon, wherein one portion of a light source connection part is divided into at least two separate branches spaced from each other along their extension, the separate branches being connected to each other at opposing ends thereof.

The light source module according to the present disclosure is used in light emitting devices, thereby obtaining much more advantages in industries.

The details of one or more embodiments are set forth in the accompanying drawings and the description below. Other features will be apparent from the description and drawings, and from the claims.

DETAILED DESCRIPTION OF THE EMBODIMENTS

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below.

Figure 1:
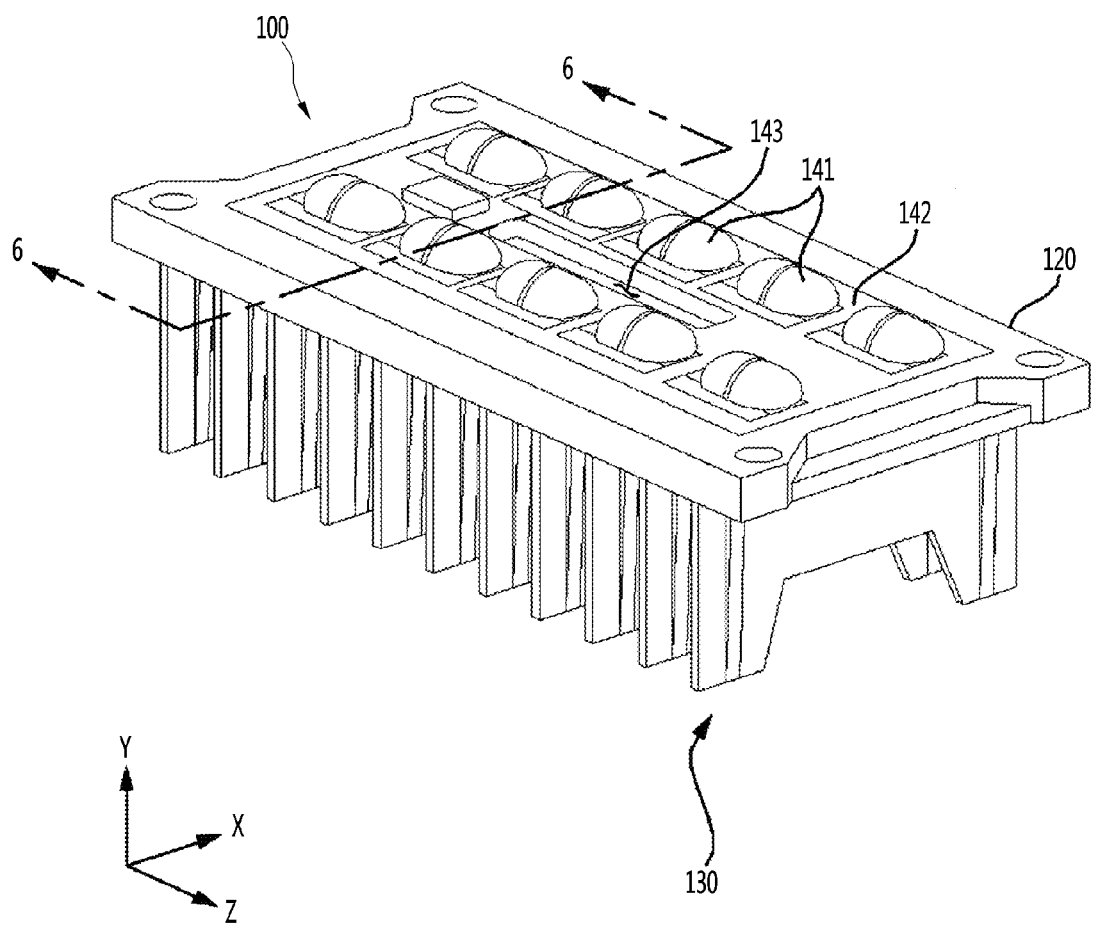
FIG. 1 is a perspective view of a light source module according to a first embodiment.
Figure 2:
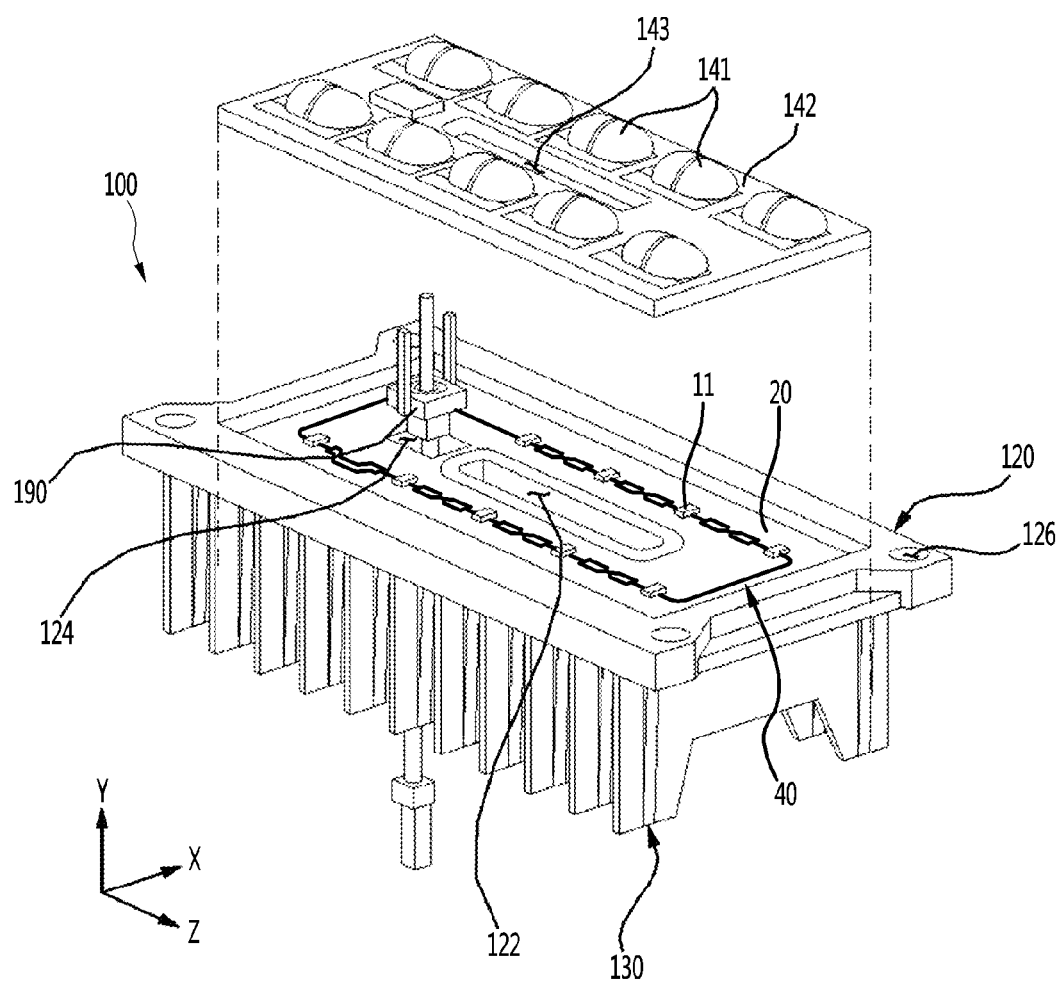
FIG. 2 is an exploded perspective view of the light source module of FIG. 1.

FIG. 1 is a perspective view of a light source module according to a first embodiment. FIG. 2 is an exploded perspective view of the light source module.

Referring to FIGS. 1 and 2, the light source module 100 according to the embodiment may include at least one light source 11 generating light and a body supporting the light source 11.

The light source 11 may include all means that generate light by being supplied with electric energy. For example, the light source 11 may include a light source in the form of a point light source. Specifically, the light source 11 may include any one of a light emitting diode and a laser diode. In the light source 11, a plurality of point light sources emitting light of different colors may be disposed adjacent to each other such that the colors are mixed with each other, thereby emitting light of white or another color.

The body is provided as a part that allows the light source 11 to perform a physical electrical action, so that the light source 11 can be stably operated. The body enables heat generated by the light source 11 to be effectively dissipated. The body is electrically connected to the light source 11 to supply power to the light source 11.

The body may include a heat sink 120. The light source 11 may be fastened to the heat sink 120 through the medium of another member, or may be directly fastened to the heat sink 120. Preferably, the light source 11 may be fastened to the heat sink 120 for the purpose of physical coupling such as support of the weight thereof. However, in order to insulate between the light source 11 and the heat sink 120, the light source 11 may be fastened to the heat sink 120 with a predetermined insulating layer 20 interposed therebetween.

A mounting part 121 (see FIG. 6) on which the light source 11 is mounted may be provided on one surface of the heat sink 120. The mounting part 121 allows heat generated by the light source 11 to be rapidly absorbed into the heat sink 120. When a heat dissipation fin 130 is connected to the other surface of the heat sink 120, the heat sink 120 may transfer, to the heat dissipation fin 130, heat generated by the light source 11 and heat generated by light emitted from the light source 11. It will be apparent that the heat dissipation fin 130 may rapidly dissipate heat to the outside. The heat sink 120 may rapidly dissipate heat to the outside.

The heat sink 120 may be formed of a metal or resin material having excellent heat radiation and heat transfer efficiencies, but the present disclosure is not limited thereto. As an example, the heat sink 120 may be an alloy made of one or two or more selected from the group consisting of aluminum (Al), gold (Au), silver (Ag), copper (Cu), nickel (Ni), tin (Sn), zinc (Zn), tungsten (W), and iron (Fe). As another example, the heat sink 120 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic. The heat sink 120 may be formed through injection molding, etching, etc., but the present disclosure is not limited thereto.

The heat sink 120 has a plate shape, and may be provided with a quadrangular planar shape. Specifically, the mounting part 121 may be formed by recessing one surface (e.g., an upper surface) of the heat sink 120. A lens cover 142 may be mounted on the mounting part 121. The mounting part 121 may be provided with a waterproof structure with the outside by the lens cover 142. The light source 11 can be waterproofed by coupling between the mounting part 121 and the lens cover 142.

A fastening hole 126 may be formed at an edge of the heat sink 120. When the light source module 100 is coupled to a lighting device, a fastening member passes through the fastening hole 126.

The body may further include the heat dissipation fin 130 and an air hole 122, which improve the heat dissipation efficiency of the heat sink 120.

The heat dissipation fin 130 may have a shape in which the area of the heat dissipation fin 130 contacted with air is maximized. The heat dissipation fin 130 is transferred with heat of the heat sink 120 to be heat-exchanged with external air. Specifically, the heat dissipation fin 130 may be provided in the shape of a plurality of plates further extending downward from the other surface (bottom surface) of the heat sink 120. More specifically, the heat dissipation fin 130 may be disposed in plurality with a predetermined pitch. In addition, the width of the heat dissipation fin 130 may be formed in a region in which it is equal to the width of the heat sink 120 such that heat of the heat sink 120 can be effectively transferred to the heat dissipation fin 130. The heat dissipation fin 130 may be formed with the heat sink 120 as a single body, or may be fabricated as a separate component part. Also, the heat dissipation fin 130 may include a material having excellent heat transfer efficiency, e.g., at least one selected from the group consisting of aluminum (Al), nickel (Ni), copper (Cu), silver (Ag), and tin (Sn). Preferably, the heat dissipation fin 130 may be integrally formed with the heat sink 120 using the same material.

Figure 3:
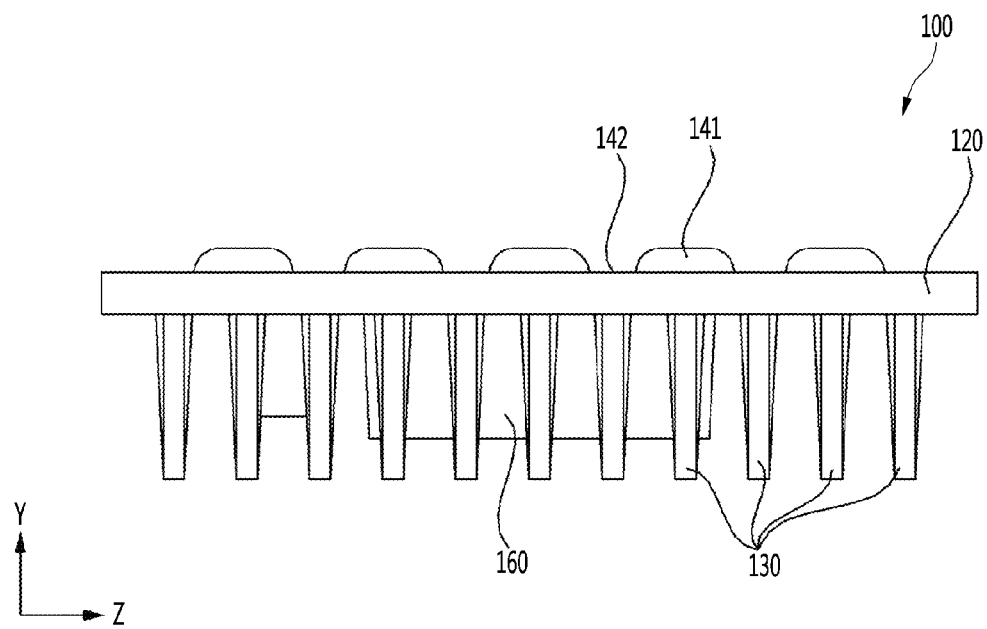
FIG. 3 is a front view of the light source module of FIG. 1.
Figure 4:
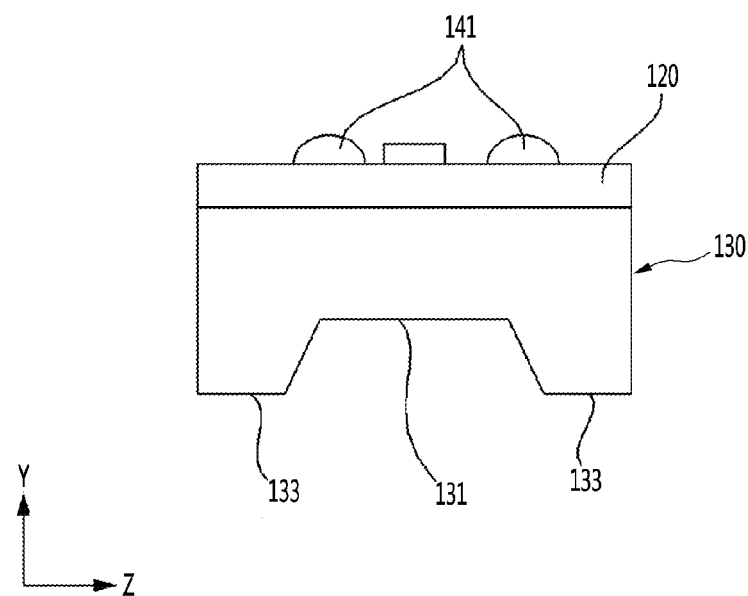
FIG. 4 is a side view of the light source module of FIG. 1.

FIG. 3 is a front view of the light source module. FIG. 4 is a side view of the light source module.

Referring to FIGS. 3 and 4, the heat dissipation fin 130 may be disposed long in the width direction of the heat sink 120. The heat dissipation fin 130 may be disposed in plurality with a predetermined pitch in the length direction of the heat sink 120. A central portion 131 of the heat dissipation fin 130 may be further depressed toward the heat sink 120 than both end portions 133 of the heat dissipation fin 130. Since the light sources 11 are positioned to vertically overlap with both the end portions 133, respectively, both the end portions 133 of the heat dissipation fin 130 are higher than the central portion 131 of the heat dissipation fin 130, and thus the contact area of the heat dissipation fin 130 can be increased. The central portion 131 of the heat dissipation fin 130 may be formed to save fabrication cost.

The air hole 122 (see FIG. 2) may be formed in the heat sink 120. The air hole 122 may be formed to vertically pass through the heat sink 120. Specifically, the air hole 122 may be formed to pass through the heat sink 120 toward the head dissipation fin 130 from the mounting part 121. The air hole 122 may provide a space in which air flows. The air hole 122 may be formed long in the length direction of the heat sink 120 at a central portion of the heat sink 120. The air hole 122 may communicate with a cover hole 143 (see FIGS. 1 and 2) formed in the lens cover 142 while vertically overlapping with the cover hole 143.

The light sources 11 may be positioned at the periphery of the air hole 122. Specifically, the light sources 11 may be disposed adjacent to the air hole 122 on the one surface of the heat sink 120, which forms the periphery of the air hole 122. Therefore, the air hole 122 may be first heated by heat generated by the light sources 11. The air hole 122 may allow air to be circulated by a temperature difference between the inside and outside of the air hole 122. The circulated air may accelerate cooling of the heat dissipation fin 130 and the heat sink 120. Specifically, the air hole 122 may be positioned to vertically overlap the central portion 131 of the heat dissipation fin 130. The light sources 11 may be positioned to respectively overlap both the end portions of the heat dissipation fin 130.

Figure 5:
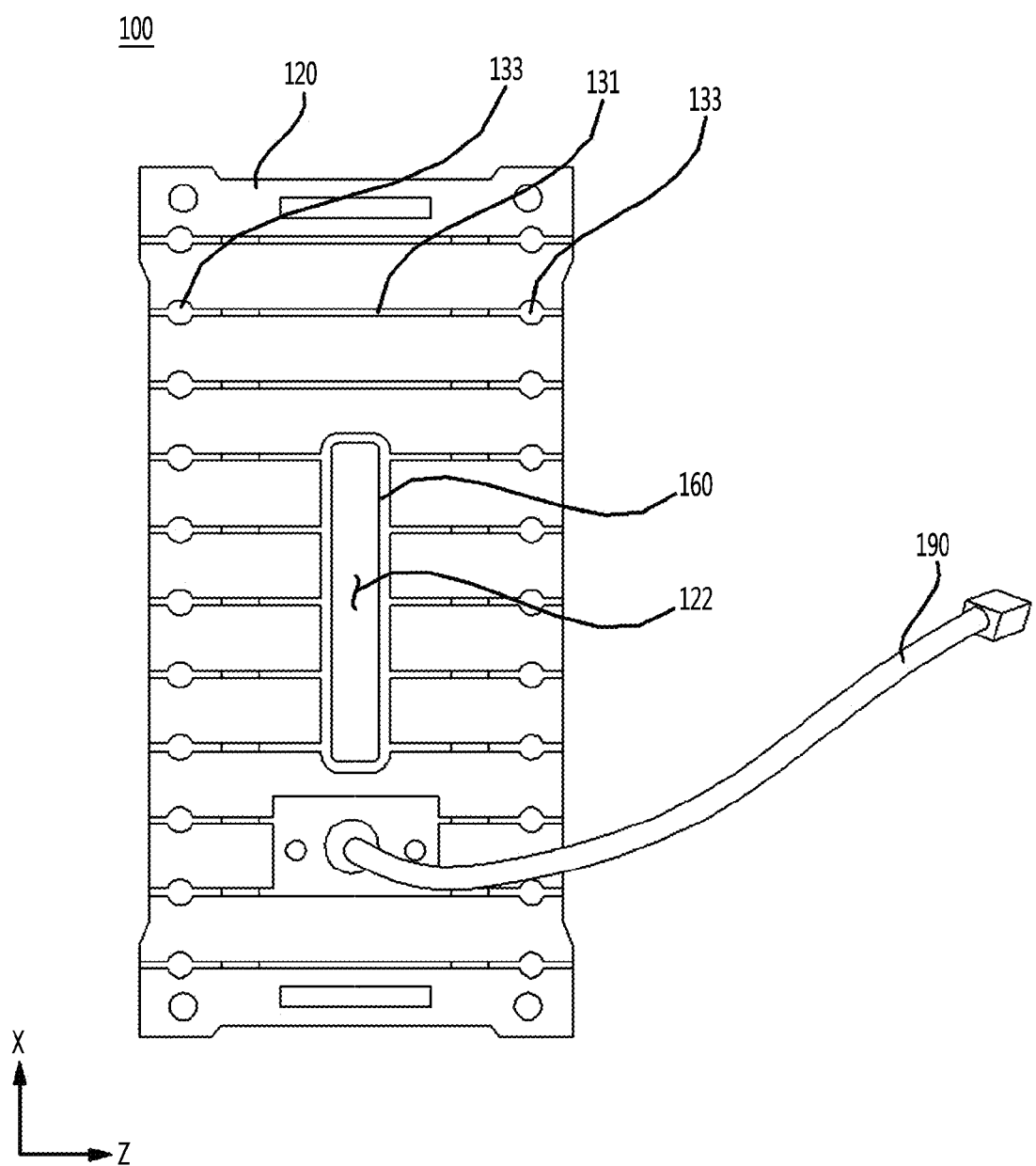
FIG. 5 is a bottom view of the light source module of FIG. 1.

FIG. 5 is a bottom view of the light source module.

Referring to FIG. 5, the light source module 100 may further include an air guiding part 160 extending downward of the heat sink 120 from the circumference of the air hole 122, the air guiding part 160 communicating with the air hole 122 to guide air. (Herein, the term "downward" assumes that the light source is at the top side, and the heat dissipation fins are on the bottom side of the light source module. In general, the air guiding part extends from the side carrying the light source to the side having the heat dissipation fins, irrespective of the final orientation of the light source module). The air guiding part 160 may be formed in the shape of a cylinder having a space therein, and the circumference of the air guiding part 160 may be configured to overlap with the circumference of the air hole 122. That is, the air guiding part 160 may be formed in the shape of a chimney surrounding the air hole 122. The section of the air guiding part 160 may be formed in the shape of a rectangle, and each corner of the rectangle may be curved.

The air guiding part 160 may be made of a material having excellent heat transfer property. For example, the air guiding part 160 may include at least one selected from the group consisting of aluminum (Al), nickel (Ni), copper (Cu), silver (Ag), and tin (Sn). Also, the air guiding part 160 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic.

The outer surface of the air guiding part 160 is connected to at least portions of a plurality of heat dissipation fins 130, so that heat transferred from the light source 11 to the heat dissipation fin 130 can be transferred to the air guiding part 160. The air guiding part 160 may further accelerate the air flowing into the air hole 122. In addition, a connector hole

124 (see FIG. 2) through which a connector 190 supplying power to the light source 11 passes may be formed in the heat sink 120.

Figure 6:
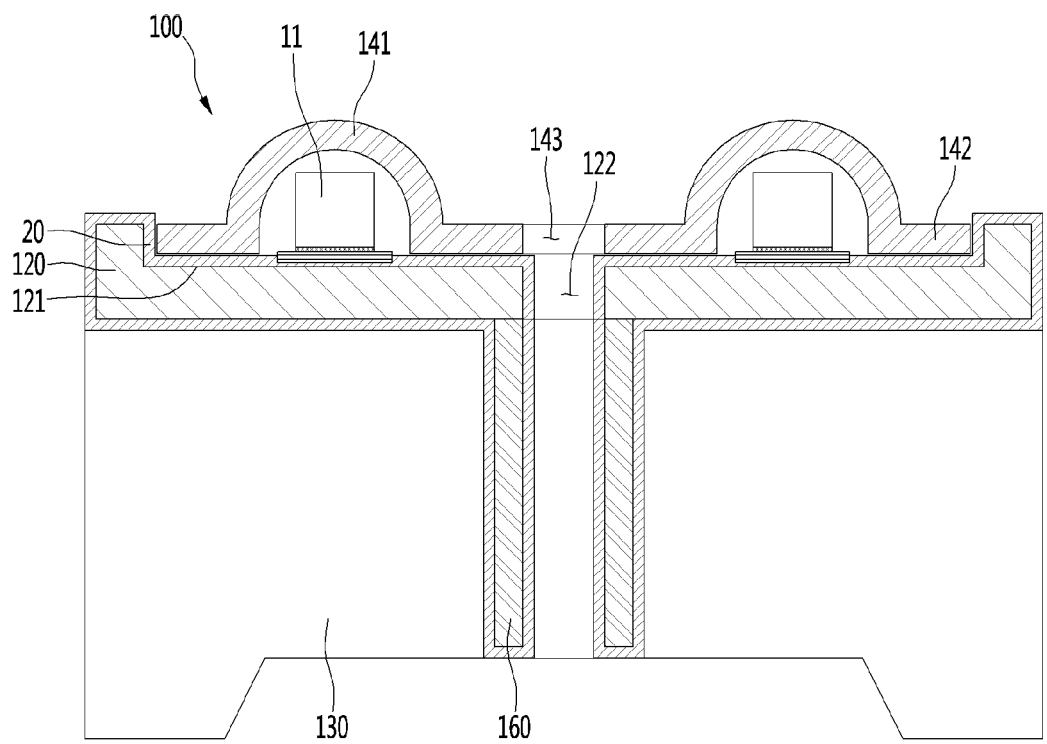
FIG. 6 is a sectional view taken along line 6-6 of FIG. 1.

FIG. 6 is a sectional view taken along line 6-6 of FIG. 1. FIG. 6 is a sectional view taken along a portion at which the light sources 11 are placed, specifically, a portion at which power is applied to the light sources 11.

Referring to FIG. 6, an electrically insulating layer 20 may be entirely formed on a surface of the heat sink 120. When the heat dissipation fin 130 and the air guiding part 160 is formed with the heat sink 120 as a single body, the insulating layer 20 may also be formed on surfaces of the heat dissipation fin 130 and the air guiding part 160. In this case, the heat sink 120, the heat dissipation fin 130, and the air guiding part 160 may be provided together by a die-casting technique, and the insulating layer 20 may be then provided.

The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer. Accordingly, a process can be rapidly and inexpensively performed.

The insulating layer 20 may electrically (but not thermally) insulate between the heat sink 120 and a conductive layer 40 which will be described later. The conductive layer 40 has electrical conductivity and hence may be electrically connected to the light source 11. The conductive layer 40 may be a path through which electric current is applied to the light source 11. Also, the conductive layer 40 may have a function of rapidly diffusing heat. To this end, the conductive layer 40 may be made of a metal material. The conductive layer 40 may include at least one selected from the group consisting of Ag, Au, Cu, and Ni.

The light source 11 may be provided as a vertical light emitting diode including two electrodes formed downwardly. If the vertical light emitting diode is mounted on the conductive layer 40, separate wire bonding is not required.

The conductive layer 40 may be provided in a recess part 21 (see FIG. 9) previously formed at a position at which the conductive layer 40 is to be provided. The recess part 21 is a region provided by etching the insulating layer 20 through laser direct structuring (LDS). The recess part 21 may be formed into a structure in which at least the bottom surface in its internal region has a rough surface including a metal core.

The conductive layer 40 may be provided in the recess part 21, to thereby form circuit patterns interconnecting the light sources 11 to the connector hole 124. The conductive layer 40 may be provided by repeatedly performing a plating process at least twice. According to an embodiment, in the conductive layer 40, Cu, Ni, and Au may be sequentially stacked to respectively provide a first plating layer 41, a second plating layer 42, and a third plating layer 43, which will be described later. With this configuration, heat generated by the light sources 11 transfers easily through the conductive layer 40 and the recess part 21 of the insulating layer 20 to reach the heat sink 120.

The method of providing the insulating layer 20, the recess part 21, and the conductive layer 40 may be performed by forming a conductive film on the insulating layer through techniques such as sputtering and electrolytic/electroless plating using a conductive material such as copper and then etching the conductive film. In this case, the recess part 21 may be previously provided in the insulating layer 20 so as to prevent a short circuit, etc. However, more preferably, the LDS may be performed because fabrication cost is inexpensive, a process can be rapidly and precisely performed, and mass production can be achieved using laser equipment.

The light source module 100 may further include a plurality of lenses 141 that shield the light sources 11 and refract light generated by the light sources 11. The lens 141 may diffuse light generated by the light source 11. The lens 141 may determine the diffusion angle of light generated by the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted and mounted into the mounting part 121 to waterproof the light source 11 from the outside.

The cover hole 143 communicating with the air hole 122 may be formed in the lens cover 142. Specifically, the cover hole 143 may be formed to vertically pass through the lens cover 142 at the center of the lens cover 142.

The insulating layer 20 may include a material capable of efficiently reflecting light. In this case, light emitted from the light source 11 and light reflected from the lens cover 142 including the lens 141 are again reflected to the outside, thereby further improving the use efficiency of light. Further, light lost as heat is reduced, thereby achieving high heat dissipation efficiency.

Figure 7:
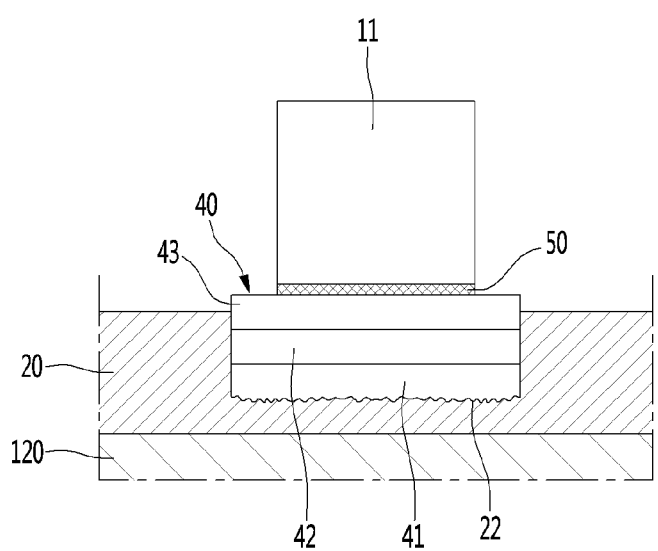
FIG. 7 is an enlarged view of a portion at which a light source is placed.

FIG. 7 is an enlarged view of a portion at which a light source is placed.

Figure 9:
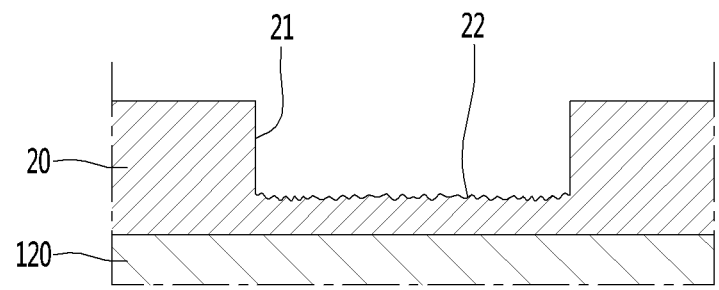

Referring to FIG. 7, a metal junction face 22 may be processed in an inner surface of the recess part 21 (see FIG. 9). In the metal junction face 22, laser is irradiated onto a plating target region, so that a surface of the insulating layer 20 can be processed as a surface having a property suitable for plating. The metal junction face 22 may be provided with a metal core, or may be processed as a lattice-shaped trench. The metal junction face 22 may include at least the bottom surface of the recess part 21.

The conductive layer 40 may be stacked on the metal junction face 22. At least one plating layer may be stacked in the conductive layer 40. For example, the conductive layer 40 may include the first plating layer 41 made of copper, the second plating layer 42 made of nickel, and the third plating layer 43 made of gold. The first plating layer 41 may be stacked to a thickness of 10 to 20 μm. The second plating layer 42 may be stacked to a thickness of 5 to 15 μm. The third plating layer 43 may be stacked to a thickness of 0.1 μm or so. The third plating layer 43 may cause an increase in material cost. Therefore, the third plating layer 43 may not be stacked.

The first plating layer 41 placed at the lowermost side of the conductive layer 40 serves as an electroconductive functional layer that can reduce the amount of heat generation by reducing electrical resistance. To this end, the first plating layer 41 may be made of copper. In order to ensure sufficient electrical conductivity, the first plating layer 41 may be formed thickest among the plating layers. The first plating layer 41 may be made of a metal having a high electrical conductivity as well as the copper.

The second plating layer 42 placed in the middle of the conductive layer 40 serves as a soldering functional layer that improves the quality of soldering. In order to perform soldering, it is necessary for a melted solder to be well wettable on the entire surface of a base material and to be well spread on the surface of the base material. The second plating layer 42 may be made of nickel as a metal for ensuring characteristics of the soldering.

The third conductive layer 43 placed at the uppermost side of the conductive layer 40 serves as a protective functional layer for protecting the plating layers 41 and 42 thereinside. The third plating layer 43 may be made of gold that is not oxidized or discolored. In the case of silver, the silver may produce a discolored LED package. Also, the silver may penetrate into an LED package and chemically react with internal component parts of a light emitting part, thereby degrading light emitting efficiency. Since the third plating layer 43 performs a function of protection, the third plating layer 43 may be provided as the thinnest layer. The second plating layer 42 may be not provided, and only the third plating layer 43 may be provided, but this is not preferable in terms of cost. Since the third plating layer 43 is provided as a considerably thin layer, the third plating layer 43 does not interfere with the function of the second plating layer 42 in the soldering.

The third plating layer 43 may be provided as resin. In this case, the resin may be stacked through another technique instead of a plating technique. The resin is not covered at a portion on which the soldering is performed, so that the soldering cannot be interfered with by the resin.

A bonding layer 50 may be provided on the conductive layer 40. The light source 11 may be placed on the bonding layer 50. The bonding layer 50 may include a low-temperature solder paste with which soldering can be performed at a low temperature. For example, the bonding layer 50 may include OM525. The bonding layer 50 may be provided by allowing the low-temperature solder paste to pass through a reflow machine in a state in which a light emitting device is mounted on the low-temperature solder paste. The soldering is performed at the low temperature, so that it is possible to prevent separation between two of the heat sink 120, the insulating layer 20, and the conductive layer 40.

FIGS. 8 to 12 are views sequentially illustrating a fabrication method of the light source module.

Figure 8:
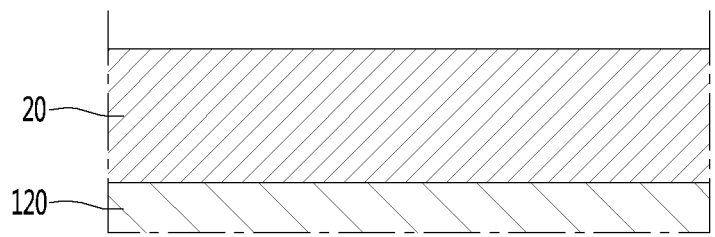
FIGS. 8 to 12 are views sequentially illustrating a fabrication method of the light source module.

First, referring to FIG. 8, the insulating layer 20 may be provided to a body fabricated by, for example, a die-casting technique. The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer. The thickness of the coated insulating layer may be 60 to 80 µm. However, the thickness is not limited thereto, and may be selected to have various dimensions according to insulation performance, heat dissipation performance, and process variables. In an embodiment, a condition may be found in which, when the light source 11 is a light emitting diode and is connected to a commercial power source, the insulation and heat dissipation of the insulating layer 20 can be ensured, and the providing of the insulating layer 20 can be performed through an inexpensive process.

The LDS may be applied to the insulating layer 20 such that the conductive layer 40 is plated on at least one portion of the surface of the insulating layer 20. The LDS is a process performed before a plating process, and refers to a process of irradiating laser onto a plating target region of the surface of the insulating layer 20, so that a plating target region of the surface of a resin molded article is reformed to have a property suitable for plating. To this end, the insulating layer 20 may contain a 'core generating agent for LDS' (hereinafter, simply referred to as a 'core generating agent') capable of forming a metal core by means of laser, or may have a predetermined pattern formed therein such that a plating layer is provided at the inner surface of the recess part 21.

First, a case where the insulating layer 20 contains a core generating agent will be described.

A core generating agent may be contained in the resin molded article providing the insulating layer 20. If laser is irradiated onto the core generating agent, a metal core may be generated as the core generating agent is decomposed. In addition, the plating target region onto which the laser is irradiated may have a surface roughness. The plating target region reformed by the laser can be suitable for plating due to the metal core and the surface roughness. The metal core may mean a core with which a metal is joined in a subsequent plating process.

The core generating agent may include a metal oxide having a spinel, a heavy metal composite oxide spinel such as copper chromium oxide spinel, a copper salt such as copper hydroxide phosphate, copper phosphate, copper sulfate, or cuprous thiocyanate, and the like. A polyester-based resin may be used as the resin molded article. Since the polyester-based resin has better adhesion with a metal, it is possible to prevent separation between the heat sink 120 and the insulating layer 20 and separation between the insulating layer 20 and the conductive layer 40, which may occur in a bonding process of the light source 11 as a subsequent process.

A case where a predetermined pattern is formed in the inner surface of the recess part 21 will be described in detail. Although the resin molded article does not contain the core generating agent, the conductive layer 40 may be provided by forming a trench line with a predetermined pattern arrangement in the plating target region. The plating process may be performed on the trench line by effectively promote the joining of a metal with the plating target region on the surface of the resin molded article. The trench line may be provided with at least two kinds of trenches intersecting each other.

The forming of the trench line with the predetermined pattern arrangement may be performed by irradiating laser onto the plating target region of the surface of the resin molded article.

FIG. 9 is a view illustrating that the recess part is provided in the insulating layer.

Referring to FIG. 9, laser may be used as a means for providing the recess part 21 in the insulating layer 20. A medium providing the laser may include, for example, yttrium aluminum garnet (YAG), yttrium orthovanadate ($YVO_4$), ytterbium (YB), $CO_2$, etc. The wavelength of the laser may be, for example, 532 nm, 1064 nm, 1090 nm, 9.3 µm, 10.6 µm, etc. An algorithm in which processing is performed by recognizing a three-dimensional (3D) shape may be used when the processing is performed using the laser. For example, a method may be applied in which the processing height of the laser is controlled by recognizing a 3D-shaped component part using a 3D recognition program and separating the component part into several levels for every height. Outer line processing may be additionally performed to achieve plating uniformity between a non-processing surface and a plating surface formed by processing the metal junction face 22 using laser.

The recess parts 21 may be provided in different thicknesses in the insulating layer 20 by changing an output value of the laser. Also, the recess parts 21 may be provided in different thicknesses in the insulating layer 20 by irradiating the laser onto the same position at least twice. For example, the processing may be performed by changing the output value of the laser between about 2 W to 30 W.

The metal junction face 22 processed by the laser has the metal core, the rough surface, and the trench, so that the conductive layer 40 can be plated in a subsequent process.

Figure 10:
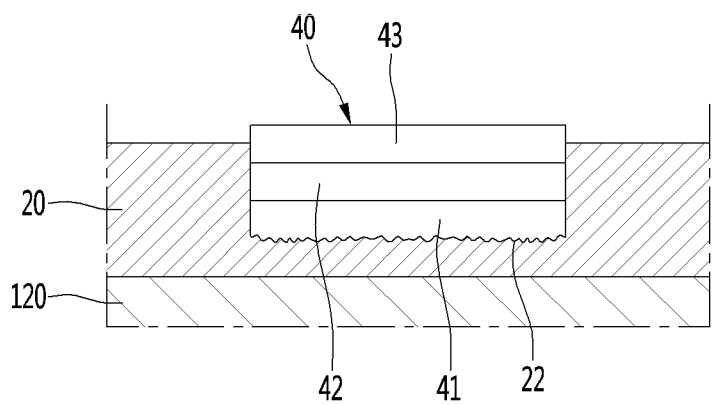

FIG. 10 is a view illustrating that the conductive layer is provided in the recess part. In the example shown in FIG. 10, the conductive layer 40 has three stacked layers 41, 42, and 43.

Referring to FIG. 10, the conductive layer 40 may be provided by plating a metal on the metal junction face 22 using an electroless process. It will be apparent that another plating process may be performed. The conductive layer 40 may be copper, nickel, gold, silver, or a combination thereof. The conductive layer 40 may be a single-layered or stacked structure. In the stacked structure, layers may be the same metal or different metals. In an embodiment, layers of copper, nickel, and gold may be sequentially stacked to have a three-layer structure.

As an embodiment, a case where the first plating layer 41 made of copper is provided will be described in detail. The heat sink 120 providing the metal junction face 22 is immersed in an electroless copper plating solution. In this case, the heat dissipation fin 130 and the air guiding part 160 may be immersed together with the heat sink 120. For example, an aqueous plating solution for electroless copper may contain about 55 ml to about 65 ml of a copper dry bathing/supplementing agent, about 55 ml to about 65 ml of an alkaline supplementing agent, about 15 ml to about 20 ml of a complexing agent, about 0.1 ml to about 0.2 ml of a stabilizing agent, and about 8 ml to about 10 ml of formaldehyde, based on deionized water.

The copper dry bathing/supplementing agent may contain, for example, about 6 parts by weight to about 12 parts by weight of copper sulfate, about 1 part by weight to about 1.5 parts by weight of polyethylene glycol, about 0.01 part by weight to about 0.02 part of weight of the stabilizing agent, and about 78 parts by weight to about 80 parts by weight of water.

The alkaline supplementing agent may contain, for example, about 40 parts by weight to about 50 parts by weight of sodium hydroxide, about 0.01 part by weight to about 0.02 part by weight of the stabilizing agent, and about 50 parts by weight to about 60 parts by weight of the water.

The complexing agent may contain, for example, about 49 parts by weight to about 50 parts by weight of the sodium hydroxide, about 0.01 part by weight to about 0.02 part by weight of the stabilizing agent, and about 50 parts by weight to about 51 parts by weight of the water.

The stabilizing agent may contain, for example, about 0.2 part by weight to about 0.3 part by weight of potassium selenocyanate, about 5 parts by weight to about 6 parts by weight of potassium cyanide, about 0.3 part by weight to about 0.4 part by weight of the sodium hydroxide, and about 92 parts by weight to about 93 parts by weight of the water.

For example, in order to provide the first plating layer 41 made of copper, a resin molded article provided with a catalyst may be immersed at a deposition speed of about 0.5 to about 0.7 $\mu$m/10 min in the electroless copper solution at about 41° C. to about 55° C. and then washed by water.

The conductive layer 40 may be stacked up to a range exceeding the depth of the recess part 21. Accordingly, the resistance of the conductive layer 40 can be reduced, and the heat conduction amount of the conductive layer 40 can be increased, thereby improving heat dissipation performance. It will be apparent that the present disclosure is not limited to the above-described configuration.

Figure 11:
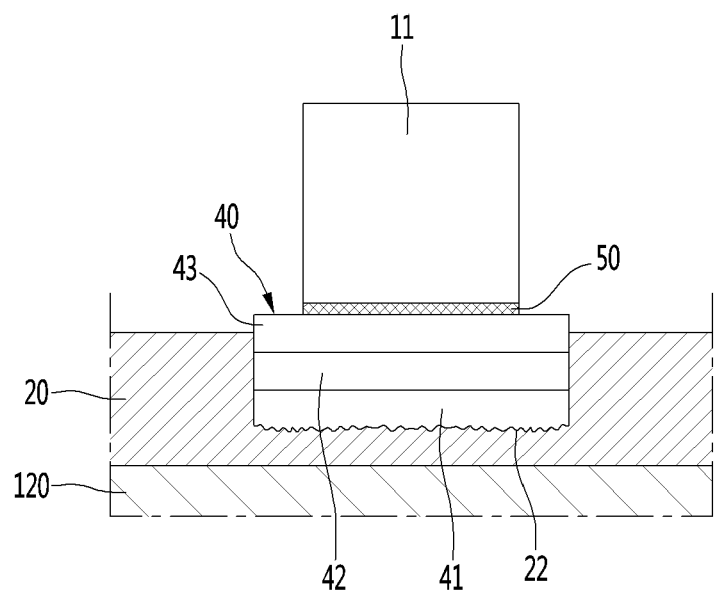

FIG. 11 is a view illustrating that the bonding layer is provided.

Referring to FIG. 11, the bonding layer 50 may be provided by applying a low-temperature solder paste on the conductive layer 40, mounting the light source 11 at a position at which the electrodes of the light source 11 are aligned on the low-temperature solder paste, and then allowing the low-temperature solder paste to pass through a reflow machine. In the reflow process, an unnecessary portion is removed from the low-temperature solder paste, and a conductive element remains, so that the conductive layer 40 and the light source 11 can be electrically connected to each other.

The low-temperature solder paste may include OM525 available at about 160° C. Since a relatively low temperature atmosphere is formed in the reflow process, it is possible to prevent separation between the insulating layer 20 and the heat sink 120 and separation between the conductive layer 40 and the insulating layer 20.

Figure 12:
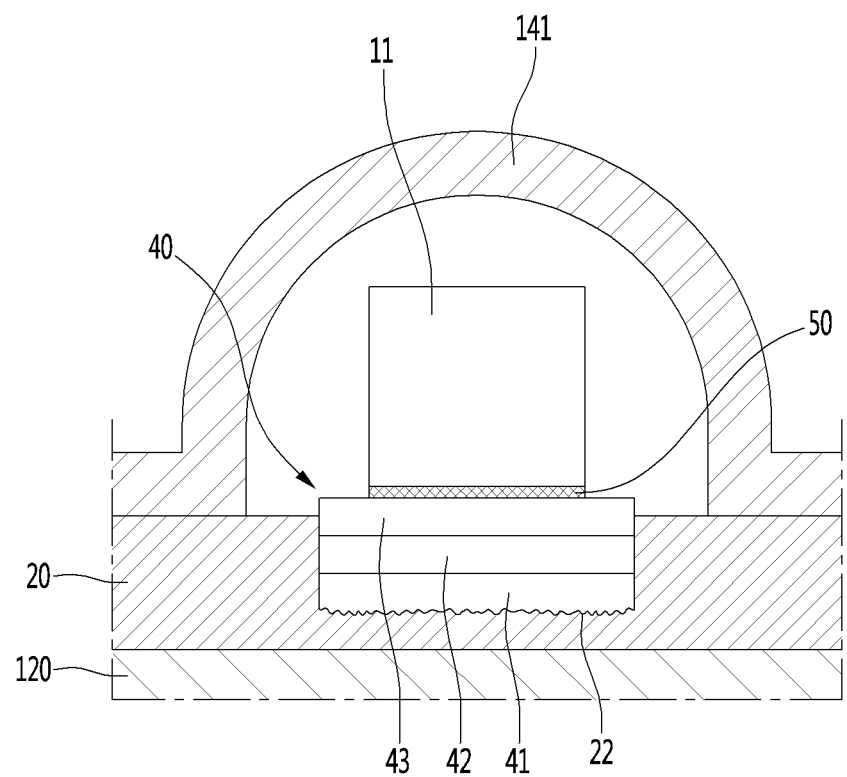

FIG. 12 is a view illustrating that the lens is further provided over the light source.

Referring to FIG. 12, the lens 141 may be provided over the light source 11. The lens 141 may shield the light source 11. Also, the lens 141 may refract and diffuse light generated by the light source 11. The lens 141 may determine the diffusion angle of light generated by the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted in the mounting part 121 to waterproof the light source 11 from the outside.

Figure 13:
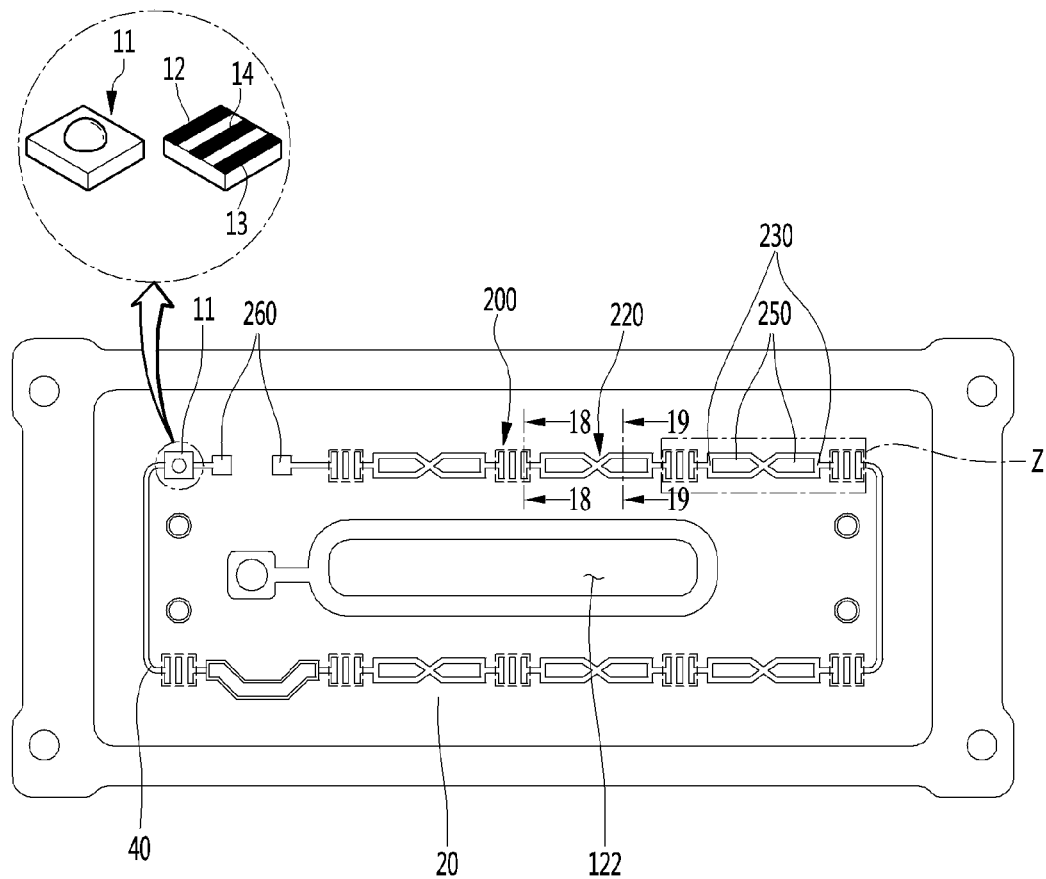
FIG. 13 is a plan view of the light source module of FIG. 1.
Figure 14:
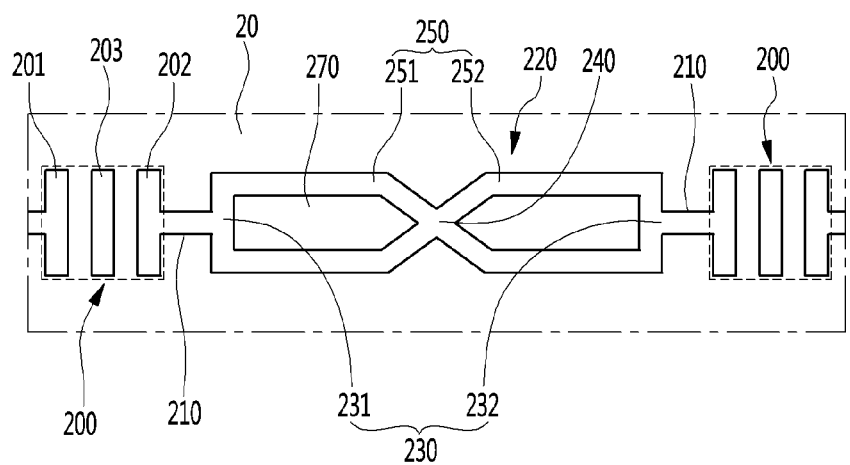
FIG. 14 is a partial enlarged view of portion Z of FIG. 13.

FIG. 13 is a plan view of the light source module of FIG. 1, which illustrates a state in which the lens cover is omitted. FIG. 14 is a partial enlarged view of portion Z of FIG. 13.

Referring to FIGS. 13 and 14, the conductive layer 40 includes a light source mounting part 200 on which the light source 11 is mounted and a light source connection part 220 provided along a path through which the light sources 11 are connected to each other. Also, the conductive layer 40 may connected with a power source part (not shown) supplying power to the light source 11. In particular, the conductive layer 40 includes a power supply part 260 supplying, to the light source mounting part 200, the power supplied from the power source part (not shown). The conductive layer 40 may further include a heat dissipation conductive layer (not shown) for heat dissipation, at a portion except for the portion of the conductive layer 40 that applies electric current to the light source 11. However, the present disclosure is not limited to the above-described configuration.

It may be understood that the light source mounting part 200 is provided by deforming at least one portion of the conductive layer 40 such that the light source 11 is mounted thereon. It may be understood that the light source connection part 220 is at least one portion of the conductive layer 40 connecting two different, typically neighboring, light sources 11 to each other. In another aspect, it may be understood that the light source connection part 220 is at least one portion of the conductive layer 40 supplying power to at least one light source 11.

The light source mounting part 200 may be formed to face a bottom surface of the light source 11. In other words, the light source mounting part 200 may be deformed depending on the bottom surface of the light source 11, which is placed on the light source mounting part 200. However, in this embodiment, it will be described that the bottom surface of the light source 11 is formed in a quadrangular shape.

The bottom surface of the light source 11 may include a positive electrode face 12 to which a positive electric current is applied, a negative electrode face 13 to which a negative electric current is applied, and a heat dissipation face 14 transferring heat generated by the light source 11. The faces may be formed to be spaced apart from each other. Therefore, the light source mounting part 200 may include a first light source mounting part 201 facing the positive electrode face 12 and a second light source mounting part 202 facing the negative electrode face 13. Also, the light source mounting part 200 may include a third light source mounting part 203 facing the heat dissipation face 14.

The first light source mounting part 201 and the second light source mounting part 202 may apply, to the light source 11, power supplied from the power supply part 260. For example, if a "positive electric current" is applied to the first light source mounting part 201, a "negative electric current" may be applied to the second light source mounting part 202. The third light source mounting part 203 may transfer heat generated by the light source 11 to the heat sink 120.

Figure 15:
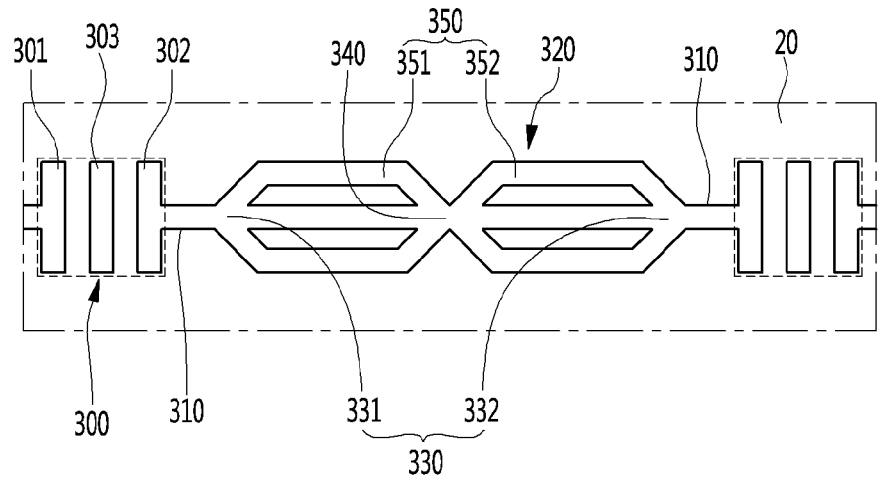
FIG. 15 is a partial enlarged view of a pattern part according to a second embodiment.

The light source connection part 220 comprises at its two opposite ends a single conductor path 210 adjacent to the respective light source mounting part 201 or 202. The light source connection part 220 may include a division part 230 (231, 232) dividing such a single conductor path 210 through which electric current is applied into two or more separate paths (in FIG. 14, two paths branched off of the single path, whereas FIG. 15 shows an embodiment with three branched off parts). The light source connection part 220 further comprises a contact part 240 in which paths divided by the division part 230 meet each other or merge with each other at one point, and a pattern part 250 between the division part 230 at each end and the contact part 240. The pattern part 250 has a plurality of paths through which electric current can flow.

The light source connection part 220 may include at least two division parts 230. Also, the light source connection part 220 may include at least one contact part 240. Alternatively, the light source connection part 220 may not include the contact part 240 (that is, the branched off conductor paths are not united at some point between the division parts 230). However, in this embodiment, it will be described that the light source connection part 220 includes at least two division parts 230 and at least one contact part 240.

The pattern part 250 may be disposed between the division part 230 and the contact part 240. Also, the pattern part 250 electrically connects the division part 230 and the contact part 240 to each other. Each conductor path in the pattern part 250 may be formed in a straight line or curved line. However, the present disclosure is not limited to the above-described configuration.

At least one contact part 240 may be provided to the light source connection part 220. The contact part 240 may be provided between a plurality of pattern parts 250. In FIGS. 14 and 15, the contact part 240 is between two pattern parts 251, 252. The contact part 240 may be formed to have the same size as the division part 230. The contact part 240 may be formed to have a wider width than the pattern part 250. However, the present disclosure is not limited to the above-described configuration.

The light source connection part 220 may be divided into at least two portions from a first division part 231. In addition, a first pattern part 251 extending from the first division part 231 may be connected to the contact part 240. In the light source connection part 220, a second pattern part 252 may extend from a second division part 232 to be connected to the contact part 240.

In another aspect, the light source connection part 220 may include the pattern part 250 of which left and right sides are symmetric with each other about the contact part 240.

According to the above-described configuration, it is possible to prevent the pattern part 250 from being deformed by high temperature. This may result in the formation of an undesired blister. Specifically, the first pattern part 251 may extend or expand from the first division part 231 to the right side based on the drawing toward the contact part 240 due to thermal deformation. The second pattern part 252 may extend or expand to the left side based on the drawing toward the contact part 240 due to thermal deformation. If at least one portion of the pattern part 250 is provided in a direction facing the contact part 240, it is possible to prevent the pattern part 250 from extending in its length direction. In other words, stress applied to the contact part 240 can be reduced by decreasing a difference in stress applied from the pattern part 250. Therefore, the light source connection part 220 may include at least one contact part 240.

In another aspect, the contact part 240 may combine electric currents divided at the first division part 231. Also, the contact part 240 may transfer the combined current to the second division part 232. Specifically, the pattern part 250 divided at the division part 230 may be provided with a width relatively narrower than that of the light source mounting part 200. If electric current is applied to the pattern part 250, the pattern part 250 may exceed allowable current. Therefore, heat of a high temperature is generated in the pattern part 250, and thermal deformation or the risk of a fire may occur as a certain time elapses. That is, the allowable current of the pattern part 250 may be decreased due to its narrowed width. In this state, if the contact part 240 having a relatively wider width than the pattern part 250 is disposed, it is possible to prevent the pattern part 250 from being deformed or heated.

In another aspect, the pattern part 250 may be configured with at least two conducting lines provided in parallel. The insulating layer 20 may form an island 270 between the conducting lines. That is, it may be understood that the island 270 forms an island at an interval between the conducting lines. Also, it may be understood that the island 270 is an island formed in the light source connection part 220.

The island 270 can prevent the conductive layer 40 from being separated from the insulating layer 20 in a process of forming the conductive layer 40 on the insulating layer 20.

In other words, the island 270 may support side portions of the conductive layer 40. Thus, the island 270 can prevent separation of the conductive layer 40.

A neck 210 may be provided between the light source mounting part 200 and the light source connection part 220. Specifically, the neck 210 may be provided at the right side (in the right direction based on the second light source mounting part 202 of FIG. 14) of the second light source mounting part 202 and the left side (in the left direction based on the first light source mounting part 201 of FIG. 14) of the first division part 231. That is, the neck 210 may be provided between the light source mounting part 200 and the division part 230. In addition, at least one neck 210 may be provided between the light source mounting part 200 and the light source connection part 220. However, the neck 210 may be provided adjacent to the light source mounting part 200 between the light source mounting part 200 and the light source connection part 220.

In another aspect, the neck 210 may be formed to have a width narrower than that of the light source mounting part 200. In other words, the neck 210 may be understood as the light source connection part 220 having a narrower width than the light source mounting part 200. In addition, the neck 210 may be provided such that its section extending from the light source mounting part 200 to the light source connection part 220 is recessed inward. However, the present disclosure is not limited to the above-described configuration.

According to the above-described configuration, it is possible to prevent the bonding layer 50 (see FIG. 7) provided on the light source mounting part 200 from flowing down in a process of coupling the light source 11 to the light source mounting part 200. Further, the direction in which the bonding layer 50 flows down can be guided. That is, is possible to prevent, in advance, malfunction of the light source 11.

The power supply part 260 may be supplied with electric current corresponding to the positive polarity from the power source part (not shown). In other words, the power supply part 260 may be provided with at least two portions to apply positive and negative electric currents. One portion of the power supply part 260 may apply the positive electric current to at least one light source mounting part 200. The other portion of the power supply part 260 may apply the negative electric current to at least one light source mounting part 200. That is, the one portion and the other portion of the power supply part 260 are connected to the light source mounting part 200, so that power can be supplied to the light source 11.

Meanwhile, the power supply part 260 may perform the same function as the light source connection part 220 in that electric current is applied to the light source 11. Therefore, like the light source connection part 220, the power supply part 260 may be provided with a path divided into at least two portions. However, the present disclosure is not limited to the above-described configuration.

The second embodiment is characterized in that any specific portion is deformed in the first embodiment. Therefore, in the second embodiment, description of the first embodiment will be applied to portions identical to those of the first embodiment.

FIG. 15 is a partial enlarged view of a pattern part according to a second embodiment.

Referring to FIG. 15, a first pattern part 351 is divided into three portions from a first division part 331. The divided first pattern part 351 extends toward a contact part 340 disposed between different light source mounting parts 300. The first pattern part 351 may extend toward the contact part 340 in a straight or diagonal direction.

A second pattern part 352 is divided from a second, opposite division part 332, and extends toward the contact part 340. That is, a pattern part 350 is provided such that its both sides are symmetric with each other about the contact part 340. However, the present disclosure is not limited to the above-described configuration.

According to the above-described configuration, the pattern part 350 can be divided into three portions from a division part 330. In addition, the pattern part 350 can extend in a diagonal line or straight line. Thus, the pattern part 350 can be provided in various shapes. In addition, it is possible to optimize the disposition of the conductive layer 40 provided on the insulating layer 20. Furthermore, the pattern part 350 is divided into at least three portions, so that the pattern part 350 can be stably connected in parallel.

The third embodiment is characterized in that any specific portion is deformed in the first embodiment. Therefore, in the third embodiment, description of the first embodiment will be applied to portions identical to those of the first embodiment.

Figure 16:
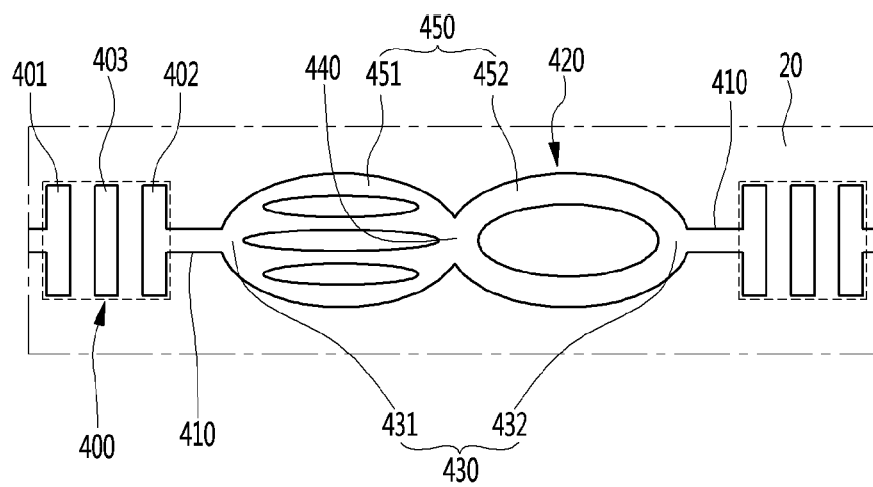
FIG. 16 is a partial enlarged view of a pattern part according to a third embodiment.

FIG. 16 is a partial enlarged view of a pattern part according to a third embodiment.

Referring to FIG. 16, a first pattern part 451 may be divided into four portions from a first division part 431. Also, the first pattern part 451 may extend in a curved line having a predetermined curvature toward a contact part 440.

A second pattern part 452 may be divided into two portions from a second division part 432. Also, the second pattern part 452 may extend in a curved line having a predetermined curvature toward the contact part 440. In other words, a pattern part 450 may be formed in a curved line extending toward the contact part 440.

According to the above-described structure, the pattern part 450 can be formed such that its both sides are not symmetric with each other about the contact part 440. In other words, the pattern part 450 can be provided in various shapes. In addition, it is possible to optimize the disposition of the conductive layer 40 provided on the insulating layer 20.

However, when numbers of paths divided from the division part 430 are different from each other, the conductor paths of the second pattern part 452 having a small number of divided paths may be provided to have a wider width than the first pattern part 451 having a large number of divided paths.

The fourth embodiment is characterized in that any specific portion is deformed in the first embodiment. Therefore, in the fourth embodiment, description of the first embodiment will be applied to portions identical to those of the first embodiment.

Figure 17:
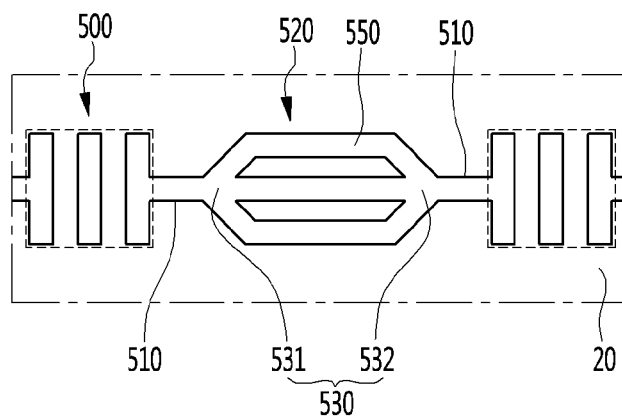
FIG. 17 is a partial enlarged view of a pattern part according to a fourth embodiment.

FIG. 17 is a partial enlarged view of a pattern part according to a fourth embodiment.

Referring to FIG. 17, a pattern part 550 may be divided from a first division part 531 to have three paths. Also, the pattern part 550 may extend toward a second division part 532. In this state, the pattern part 550 may be provided as at least one. In other words, a contact part is not provided in a light source connection part 520.

In another aspect, the pattern part 550 may be provided in at least one straight line having three paths. However, the present disclosure is not limited to the above-described configuration.

However, when the contact part 240 is not provided, the pattern part 550 may be designed by considering that it is deformed by high temperature. Specifically, the pattern part 550 may be weak against the generation of heat corresponding to the allowable current, as compared with the structure having the contact part 240. Therefore, the conductive layer 40 provided on the insulating layer 20 may increase. In another aspect, the recess parts 21 provided in the insulating layer 20 may be formed in different depths. However, the present disclosure is not limited to the above-described configuration. Preferably, the thickness where the conductive layer 40 is stacked in the recess part 21 and the depth where the recess part 21 is provided in the insulating layer 20 may be changed depending on a number of paths of the pattern part 550 or a number of paths divided from a division part 530.

According to the first to fourth embodiments, the thickness where the conductive layer 40 is stacked in the recess part 21, the depth of the recess part 21, and the width where the conductive layer 40 is provided in the recess part 21 may be changed depending on a number of paths of the pattern part 250. However, the present disclosure is not limited to the above-described configuration.

In these embodiments, the height H where the conductive layer 40 is stacked in the recess part 21 of the insulating layer 20 may be referred to as a thickness. The width W where the pattern part 250 is provided on the insulating layer 20 may be referred to as a breadth. In addition, the depth where the recess part 21 is recessed downward based on the insulating layer 20 so as to provide the conductive layer 40 may be referred to as a depth of the recess part 21. However, the present disclosure is not limited to the above-described configuration.

The thickness H or the width W will be described in detail below.

Figure 18:
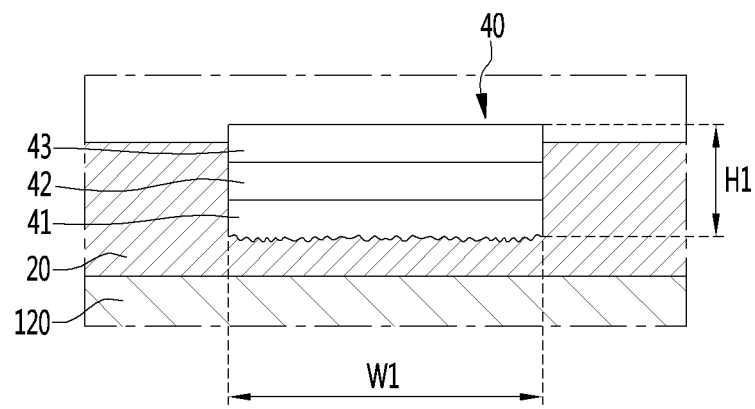
FIG. 18 is a partial sectional view taken along line 18-18 of FIG. 13.
Figure 19:
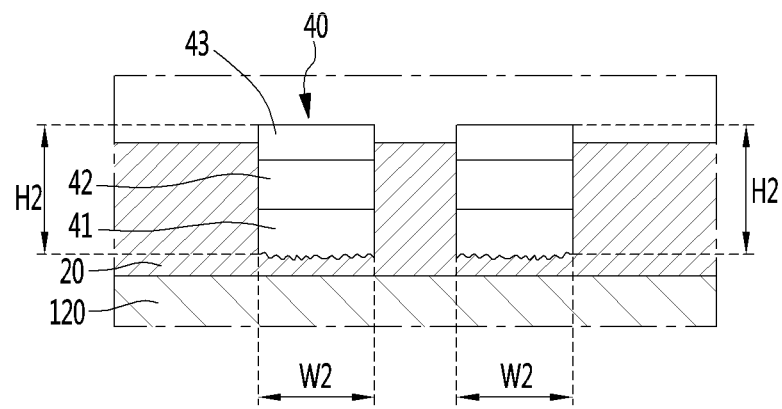
FIG. 19 is a partial sectional view taken along line 19-19 of FIG. 13.

FIG. 18 is a partial sectional view taken along line 18-18 of FIG. 13. FIG. 19 is a partial sectional view taken along line 19-19 of FIG. 13.

Referring to FIG. 18, the thickness H may be understood as a height of the conductive layer 40 provided on the insulating layer 20. In other words, that the thickness H increases may be understood that the height of the first plating layer 41, the second plating layer 42, and the third plating layer 43, which are stacked in the conductive layer 40, increases. Also, the height H may be understood as a height of the conductive layer 40 from the metal junction face 22 provided at the insulating layer 20. Also, the height H may be understood as a length from the bottom surface of the first plating layer 41 disposed at a lower end portion of the conductive layer 40 to the top surface of the third plating layer 43 disposed at an upper end portion of the conductive layer 40.

The light source mounting part 200 may receive electric current applied from the power source part (not shown) so as to supply power to the light source 11. Also, electric current may be applied to different light source mounting parts 200. In other words, the light source mounting part 200 may be provided to have a predetermined thickness according to the intensity of electric current supplied from the power source part (not shown). Therefore, the light source mounting part 200 may have a relatively greater thickness than the pattern part 250. In this state, the light source mounting part 200 has a predetermined thickness H1 and a width W1. Also, the pattern part 250 may have predetermined first and second thicknesses H2 and predetermined first and second widths W2. Also, the pattern part 250 may have different first and second thicknesses H2 and different first and second widths W2. However, in this embodiment, it will be described that the first and second thicknesses H2 are equal to each other and the first and second widths W2 are equal to each other.

The thickness H of the conductive layer 40 or the width W of the conductive layer 40 may be changed depending on the conductive layer 40 provided on the insulating layer 20. In other words, the thickness H of the conductive layer 40 or the width W of the conductive layer 40 may be changed depending on the depth or width of the recess part 21 provided in the insulating layer 20.

A case where the light source mounting part 200 is provided on the insulating layer 20 will be described. The conductive layer 40 (see FIG. 18) may be provided to have a relatively thin thickness H1. Also, the conductive layer 40 may be provided to have a relatively wider width W1.

On the other hand, a case where the pattern part 250 is provided on the insulating layer 20 will be described. The conductive layer 40 (see FIG. 19) may be provided to have a relatively thick thickness H2. Also, the conductive layer 40 may be provided to have a relatively narrow width W2. In addition, the conductive layer 40 may be divided into at least two portions. In other words, the thickness H2 or width W2 of the conductive layer 40 may be changed depending on paths divided from the division part 230.

According to the above-described configuration, it is possible to easily change the sectional area of the conductive layer 40 to which electric current is applied. Thus, the conductive layer 40 can be designed to be optimized according to an allowable current applied thereto. Further, it is possible to reduce the amount of a conductive material unnecessarily used in the conductive layer 40.

Figure 20:
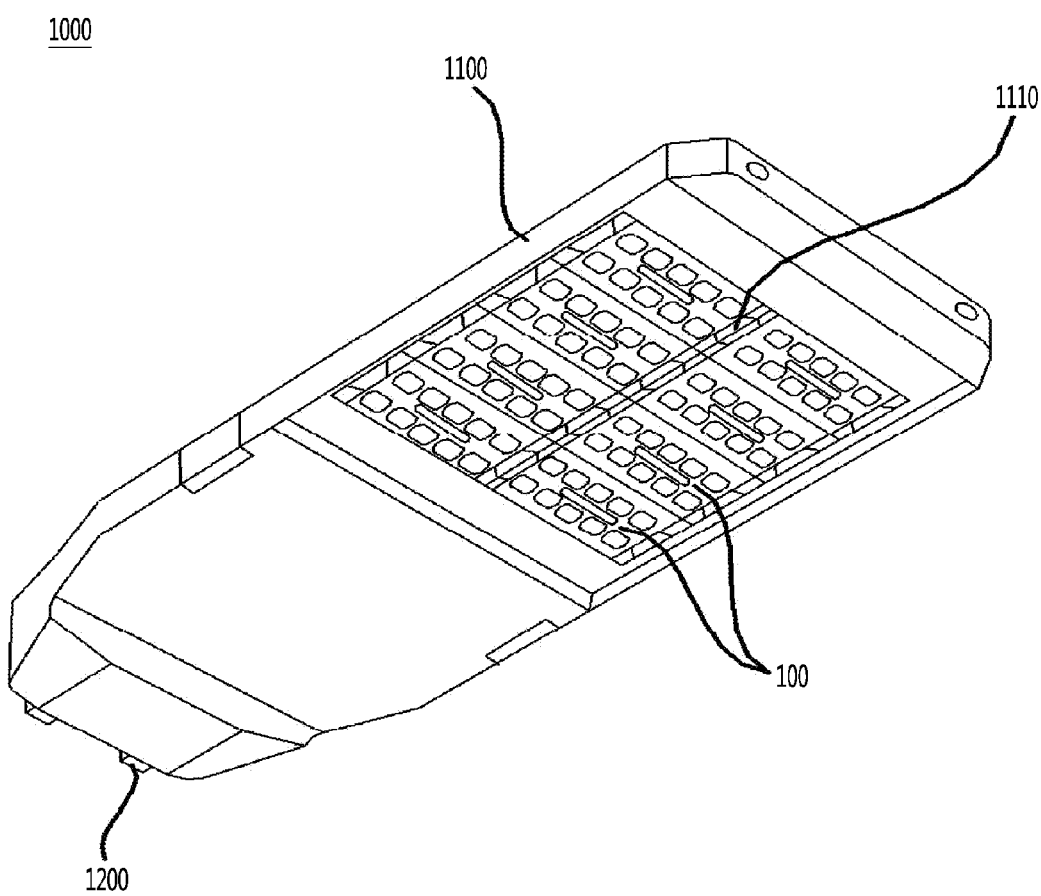
FIG. 20 is a perspective view of a lighting device including light source modules according to an embodiment.

FIG. 20 is a perspective view of a lighting device including light source modules according to an embodiment.

Referring to FIG. 20, the lighting device 1000 according to the embodiment may include a main body 1100 providing a space in which lighting modules 100 are coupled thereto, the main body 1100 forming an external appearance, and a connection part 1200 having a built-in power source (not shown) coupled to one side of the main body 1100 to supply power, the connection part 1200 connecting the main body 1100 to a supporting part (not shown). The lighting device 1000 according to the embodiment may be installed indoors or outdoors. For example, the lighting device 1000 according to the embodiment may be used as a streetlight. The main body 1100 may be provided with a plurality of frames 1110 capable of providing a space in which at least two light source modules 100 are positioned. The connection part 1200 has the power source (not shown) built therein and connects the main body 1100 to the supporting part (not shown) fixing the main body 1100 to the outside.

If the lighting device 1000 according to the embodiment is used, heat generated by the light source modules 100 can be effectively cooled due to a chimney effect. Further, a separate fan is not used, and thus fabrication cost can be reduced.

According to the present disclosure, due to effects such as rapid fabrication processes, inexpensive fabrication cost, facilitation of mass production, and improvement of product yield, many advantages can be expected in the production of lighting devices.

Particularly, products can be inexpensively fabricated at high speed. Thus, it is possible to promote the spread of lighting devices using light emitting diodes.

According to the present disclosure, the composition and disposition of a conductive material applying electric current to light sources are optimized, so that it is possible to reduce fabrication cost and to obtain stabilized operations. Thus, the present disclosure can be used in various application fields including medical science, sterilization, spectral analysis, and the like, as well as lighting.

According to the present disclosure, a light source connection part constituting a conductive layer is divided into at least two portions to be connected to each other, so that it is possible to stably apply electric current and to optimize the disposition of a conductive material.

Also, a contact part is provided such that divided portions of a conductive layer meet each other at one point. Thus, it is possible to prevent the conductive layer from being deformed by high temperature.

Also, a neck is formed between a light source connection part and a light source mounting part, so that it is possible to prevent a bonding material from flowing down in a process of bonding a light source to the light source mounting part. Further, it is possible to prevent malfunction of the light source module.

According to the present disclosure, a conductive material constituting a conductive part has different thicknesses or widths, so that it is possible to efficiently solve a problem in that the conductive material is excessively used. Further, it is possible to further optimize the disposition of the conductive part.

According to the present disclosure, an insulating layer is stacked on the heat sink by a powder coating technique, a bottom surface recessed through a laser process is provided in the insulating layer, and a plating layer is provided on the recessed bottom surface. Thus, a process that has inexpensive fabrication cost and is suitable for mass production can be performed without using any high-priced printed circuit board and thermal pad. Accordingly, the light source module can be rapidly fabricated.

Furthermore, it is possible to obtain various effects that can be understood through configurations described in the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light source module comprising:
   at least one light source configured to emit light;
   a heat sink supporting the light source on a top surface thereof, the heat sink configured to absorb heat from the light source and dissipate the heat to the outside;
   an electrically insulating layer applied to at least one surface of the heat sink; and
   a conductive layer applied to at least one portion of the insulating layer, the conductive layer providing a path for supplying electric current to the light source,
   wherein the conductive layer comprises:
      light source connection parts providing a conducting path configured to supply electric current to the light source; and
      a light source mounting part disposed between two of the light source connection parts, the light source mounting part having the light source mounted thereon,
   wherein one portion of at least one of the light source connection parts is divided into at least two separate branches spaced from each other along their extension, the separate branches being connected to each other at opposing ends thereof.

2. The light source module according to claim 1, wherein the light source connection part comprises:
   a division part dividing the conducting path into at least two conducting paths forming a pattern part.

3. The light source module according to claim 2, further comprising a contact part in which the conducting paths of the pattern part meet each other at one point.

4. The light source module according to claim 2, wherein at least one portion of the pattern part is provided in a straight line or curved line.

5. The light source module according to claim 2, wherein the conducting paths of the pattern part are disposed at both sides of the contact part, respectively.

6. The light source module according to claim 3, wherein the pattern part is provided such that its left and right sides are symmetric with each other about the contact part.

7. The light source module according to claim 1, wherein the heat sink comprises:
   a heat dissipation fin provided on a bottom surface of the heat sink, the heat dissipation fin dissipating heat to the outside; and
   an air hole passing through the heat sink.

8. The light source module according to claim 1, wherein a neck having a narrower width than at least the light source mounting part is provided between the light source mounting part and the light source connection part.

9. The light source module according to claim 1, wherein the conductive layer is provided in a single layer made of a metal selected from the group consisting of copper, nickel, silver, and gold.

10. The light source module according to claim 1, wherein the conductive layer is provided by plating, in multiple layers, the same metal or different metals, selected from the group consisting of copper, nickel, silver, and gold.

11. The light source module according to claim 10, wherein copper is stacked at a lower portion of the conductive layer, and nickel is stacked at an upper portion of the conductive layer.

12. A lighting device using the light source module according to claim 1.

13. A light source module comprising:
   at least one light source configured to emit light;
   a heat sink supporting the light source on a top surface thereof, the heat sink configured to absorb heat from the light source and dissipate the heat to the outside;
   an electrically insulating part provided on at least one surface of the heat sink; and
   a conducting part provided on the insulating part, the conducting part configured to supply electric current to the light source,
   wherein the conducting part comprises:
      a first conducting part on which the light source is mounted, the first conducting part having a first width; and
      a second conducting part having a second width narrower than the first width, the second conducting part being divided into at least two branch portions.

14. The light source module according to claim 13, wherein the first conducting part and the second conducting part are provided in different thicknesses, so that different allowable currents are applied thereto.

15. The light source module according to claim 13, wherein the first conducting part is provided with a light source mounting part.

16. The light source module according to claim 13, wherein the second conducting part is provided with a light source connection part.

17. The light source module according to claim 13, wherein the insulating part comprises an electrically insulating layer applied to at least one surface of the heat sink, and wherein the conducting part comprises a conductive layer applied to at least one portion of the insulating layer.

18. A lighting device using the light source module according to claim 13.

19. A method for fabricating a light source module, the method comprising:

providing a light source;

providing a heat sink to support the light source;

applying an electrically insulating layer on at least one surface of the heat sink;

applying a conductive layer on at least a portion of the insulating layer, the conductive layer providing a path for supplying electric current to the light source, wherein the conductive layer comprises:

light source connection parts configured to supply electric current to the light source; and a light source mounting part disposed between two of the light source connection parts, the light source mounting part having the light source mounted thereon, wherein one portion of at least one of the light source connection parts is divided into at least two separate branches spaced from each other along their extension, the separate branches being connected to each other at opposing ends thereof.

20. The method according to claim 19, wherein the insulating layer is applied on the entire surface of the heat sink.

* * * * *